(12) United States Patent
Yu

(10) Patent No.: US 7,376,167 B2
(45) Date of Patent: May 20, 2008

(54) TUNABLE RING LASER WITH EXTERNAL GRATING OPERATION IN A SINGLE MODE

(75) Inventor: Siyuan Yu, Bristol (GB)

(73) Assignee: The University of Bristol, Bristol (GB)

( * ) Notice: Subject to any disclaimer, the term of this patent is extended or adjusted under 35 U.S.C. 154(b) by 241 days.

(21) Appl. No.: 10/524,049

(22) PCT Filed: Aug. 8, 2003

(86) PCT No.: PCT/GB03/03487

§ 371 (c)(1),
(2), (4) Date: Oct. 18, 2005

(87) PCT Pub. No.: WO2004/015827

PCT Pub. Date: Feb. 19, 2004

(65) Prior Publication Data

US 2006/0153268 A1    Jul. 13, 2006

(30) Foreign Application Priority Data

Aug. 8, 2002    (GB)    .................... 0218472.9

(51) Int. Cl.
*H01S 3/10* (2006.01)
*H01S 3/083* (2006.01)
(52) U.S. Cl. .......................................... 372/94; 372/20
(58) Field of Classification Search .............. 372/94, 372/20, 32, 92, 99, 101, 102
See application file for complete search history.

(56) References Cited

U.S. PATENT DOCUMENTS

| 4,314,210 | A | 2/1982 | Everett |
| 5,231,642 | A | 7/1993 | Scifres et al. |
| 5,416,583 | A | 5/1995 | Sanzari |
| 6,134,250 | A | 10/2000 | Koren et al. |
| 6,289,032 | B1 | 9/2001 | Fay et al. |
| 6,324,204 | B1 * | 11/2001 | Deacon .................. 372/96 |
| 6,856,641 | B2 * | 2/2005 | Ksendzov .............. 372/108 |

(Continued)

FOREIGN PATENT DOCUMENTS

JP    090064440 A    3/1997

(Continued)

OTHER PUBLICATIONS

Wei, L., et al "Er-doped Fiber Ring Laser with an External Fiber Bragg Grating"; *Laser and Electro-Optics Society Annual Meeting*; (1997) Leos '97 10th Annual Meeting. Conference Proceedings., IEEE; pp. 382-383; XP010252795.

(Continued)

*Primary Examiner*—Armando Rodriguez
(74) *Attorney, Agent, or Firm*—Nixon & Vanderhye P.C.

(57) ABSTRACT

A tunable lasing device (100) comprising a ring-shaped laser cavity (102), an optical gain element (104), a bi-directional output coupler (106) and a frequency selection means (114). The frequency selection means is generally a grating with a refractive index that determines a grating reflection frequency. Single mode laser operation is achieved where a cavity mode frequency of the ring-shaped laser cavity coincides with a grating reflection frequency. The refractive index of the grating can be modified by the injection of a variable current. In this way, the lasing frequency can be rapidly tuned between cavity mode frequencies.

28 Claims, 4 Drawing Sheets

U.S. PATENT DOCUMENTS

2001/0028769 A1    10/2001    Deacon

OTHER PUBLICATIONS

Yang, J., et al; "Wideband Wavelength Tunable Fiber Ring Laser with Flattened Output Power Spectrum"; *Optics Communications, North-Holland Publishing Co.*; vol. 210, No. 3-6 (2002); XP004380469.

Liaw, S.K., et al; "Power Equalized Wavelength-Selective Fiber Lasers Using Fiber Bragg Gratings"; *Optics Communications, North-Holland Publishing Co.*; vol. 155, No. 4-6; pp. 255-259 (1989); XP-004146448.

Li, Shenping, et al; Optical Fiber Communications Conference 1999 and Int. Conf. Integrated Optics and Optical Fibre Communication OFC/IOOC '99; *Technical Digest*, vol. 1, pp. 7-9; "Wavelength-tunable actively mode-locked fibre ring laser with a Fabry-Perot semiconductor modulator based on carrier-induced refractive index change".

Chawki et al; Electronics Letters, vol. 29, No. 23, pp. 2034-2035; "All fibre, 1.5 μm widely tunable single frequency and narrow linewidth semiconductor ring laser with fibre Fabry Perot filter".

Shenping, L., et al; "Wavelength-Tunable Actively Mode-Locked Fiber Ring Laser with a Fabry-Perot Semiconductor Modulator Based on Carrier-Induced Refractive Index Change"; *Optical Fiber Communications Conference 1999 and Int. Conf. Integrated Optics and Optical Febre Communication OFC/IOOC '99; Technical Digest*; vol. 1; pp. 7-9.

\* cited by examiner

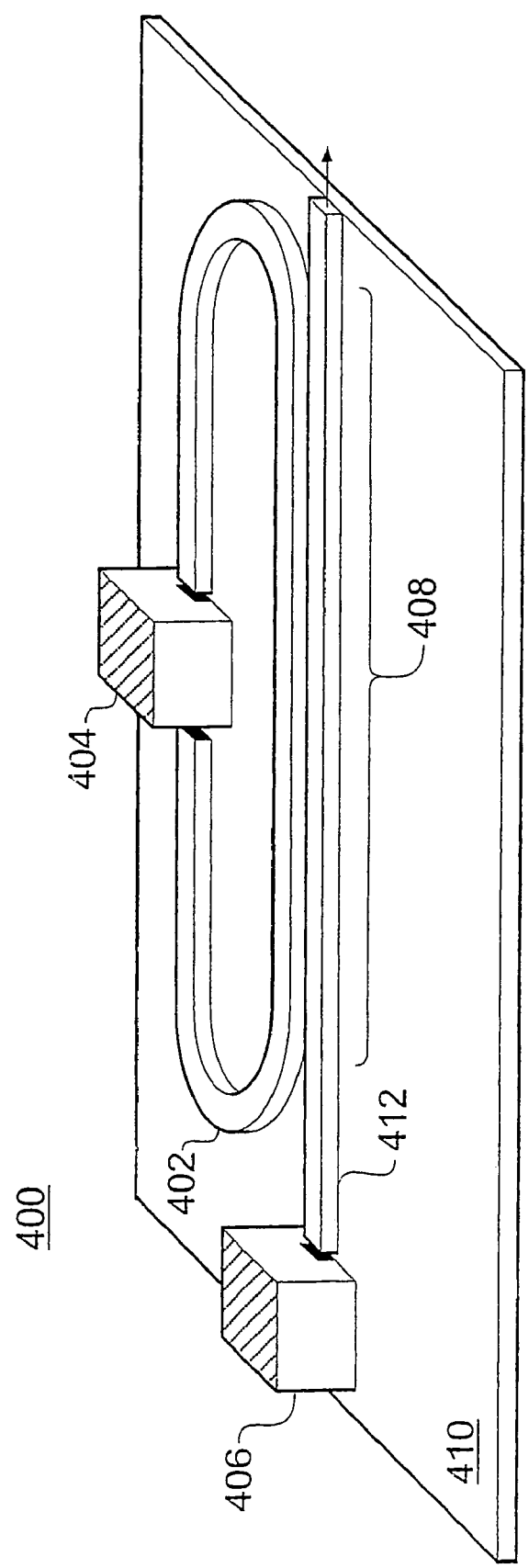

TUNABLE RING LASER WITH EXTERNAL GRATING OPERATION IN A SINGLE MODE

This application is the U.S. National Phase of International Application PCT/GB20031003487, filed 8 Aug. 2003, which designated the U.S. PCT/GB20031003487 claims priority to British Application No. 0218472.9 filed 8 Aug. 2002. The entire content of these applications are incorporated herein by reference.

TECHNICAL FIELD OF THE TECHNOLOGY

The present technology relates to an optoelectronic device, and in particular to a lasing device that can change an emitted wavelength at high speed.

DESCRIPTION OF RELATED ART

Tunable lasers are commonly used as sources in high capacity optical telecommunication systems, such as dense wavelength division multiplexing (DWDM) systems. This technique involves transmitting several optical signals via a single fibre with the optical signals having slightly differing respective wavelengths or frequency. A related technique, known as wavelength routing, involves transmitting data using precise wavelengths and rapidly interchanging between those wavelengths. Tunable lasers are also used in photonic switching systems and also find application in other fields, such as spectroscopy and optical sensing.

Examples of conventional tunable semiconductor diode lasers used for optical communications are listed below.

A first type is known as a "Y-cavity laser" (see M. J. Kuznetsov, J. of Lightwave Technology, Vol. 12, Issue 12, Dec. 1994), in which extended tuning (near 40 nm) is achieved by adopting an external interferometer. However, Y-cavity lasers suffer from a limited side mode suppression ratio (SMSR) of less than 25 dB.

A second type of conventional tunable laser is known as "grating assisted co-directional coupler (GACC) laser" (see Z. M. Chuang, and L. A. Coldren, IEEE J. of Quantum Electronics, Vol. 29 Issue 4, April 1993), which also suffers from a limited SMSR, due to broadening of a gain-filter bandwidth whilst the laser is tuned. It also needs a multiple of control electrodes making tuning complicated.

A third type of conventional tunable laser is the distributed Bragg reflector (DBR) laser family, particularly a device known as a "sampled grating distributed Bragg reflector (SGDBR) laser" which offers a wide tuning range (see L. A. Coldren, IEEE J. of Selected Topics in Quantum Electronics, Vol. 6, Issue 6, November-December 2000 and references therein; F. Delorme, IEEE J. of Quantum Electronics, Vol. 34 Issue 9, September 1998). In order to set an operating wavelength or frequency for SGDBR lasers it is necessary to determine at least three control variables. Each control variable is an external current source with a value determined from a multi-dimensional look-up table (which must be pre-programmed in a time consuming 'training' process). The process of determining the control variables involves processing in several different zones in the multi-dimensional variable space. The slow speed of this processing leads to an inadequate tuning speed for efficient operation of, for example, optical packet transmission systems. This problem is further compounded by transient phenomena in the laser cavity which have relatively long decay times (such as thermal stabilizing time for the grating). SGDBR lasers generally include phase matching components which add complexity and increase the dimensions of the device.

In addition, a further type of tunable laser is a ring laser with intra-cavity tuning means such as a grating distributed reflector or tunable optical filter. This generally comprises a ring cavity laser with a grating or filter forming at least part of the ring cavity. Known devices generally use rare-earth doped optical fibre to form the ring cavity laser. However, where a tuning mechanism is a part of the ring cavity and the laser cavity circumference is relatively short, then problems similar to those encountered in tunable SGDBR lasers arise. Further, the circumference of the ring cavity determines the photon lifetime and thereby also affects the speed with which such known devices can be tuned. Thus, a greater circumference is associated with a slower frequency tuning speed. (For example, a fibre ring cavity laser generally has a circumference of greater than 1 m and thus a photon round trip time of greater than 5 nanoseconds. Therefore, in such known devices, a tuning speed on a nanosecond timescale is not possible.)

Therefore, the present technology seeks to provide a tunable laser in which the problems of conventional tunable lasers are at least alleviated.

SUMMARY

According to a first aspect of the exemplary embodiment presented herein, there is provided a lasing device comprising a ring cavity, a coupling means for extracting laser emission from the ring cavity, and a frequency selection means in connection with the coupling means, wherein the frequency selection means is operable to feed back part of the extracted laser emission into the ring cavity and to select the frequency of the feedback signal, and the frequency selection means is not part of the ring cavity.

The tunable lasing device as described above can be utilised in an optical communication system.

According to a second aspect of an exemplary embodiment, there is provided a method of changing a lasing frequency of a ring cavity laser, the method comprising operating the ring cavity laser at a first ring cavity resonant frequency, wherein the first ring cavity resonant frequency substantially coincides with a first reflecting frequency of a frequency selection means, controlling the frequency selection means to change the first reflecting frequency to a second reflecting frequency, and operating the ring cavity laser at a second ring cavity resonant frequency, wherein the second ring cavity resonant frequency substantially coincides with the second reflecting frequency of the frequency selection means.

Furthermore, the frequency selection means of the exemplary embodiment is not part of the ring cavity, i.e. the ring cavity is close-looped and will work as a resonant cavity without the frequency selection means.

Advantageously, the tunable laser of the exemplary embodiment emits precise, discrete wavelengths as determined by the cavity modes of the ring laser cavity. These modes are determined during laser manufacture and can be precisely trimmed to the accurate values required.

Further advantage is gained in that the lasing frequency tuning occurs at a high speed (potentially in the order of nanoseconds) Primarily, four factors contribute to achieving this high speed tuning. Firstly, a frequency selection means which operates at a high speed is used. Secondly, a lasing frequency lock-in time of the present invention is shorter than that of conventional tunable lasers. Lasing frequency lock-in time refers to the time for an output frequency stabilize to a predetermined value. Thirdly, only a single control variable needs to be determined in order to set an operating frequency for the tunable laser. Fourthly, after the initial lasing frequency lock-in time, the emitted frequency is no longer affected by possible long-term transience (such as thermal drift of the frequency selection means). In this way, the time required for the tunable laser to change between different emitted frequencies is minimized and also, phase matching components (as required in some SGDBR lasers) are not necessary. Furthermore, the preferred embodiments have a ring cavity circumference of a few millimetres in length, which is considerably shorter than that of conventional tunable fibre ring devices. Laser devices of this short cavity length are capable of high speed tuning owing to the short photon lifetime in the ring cavity.

BRIEF DESCRIPTION OF THE DRAWINGS

For a better understanding of the exemplary embodiment presented herein, and to show how it may be put into effect, reference will now be made, by way of example, to the accompanying drawings in which:

FIG. 4 illustrates a ring cavity laser of a third exemplary implementation.

DETAILED DESCRIPTION OF PREFERRED EMBODIMENT

Figure 1A:
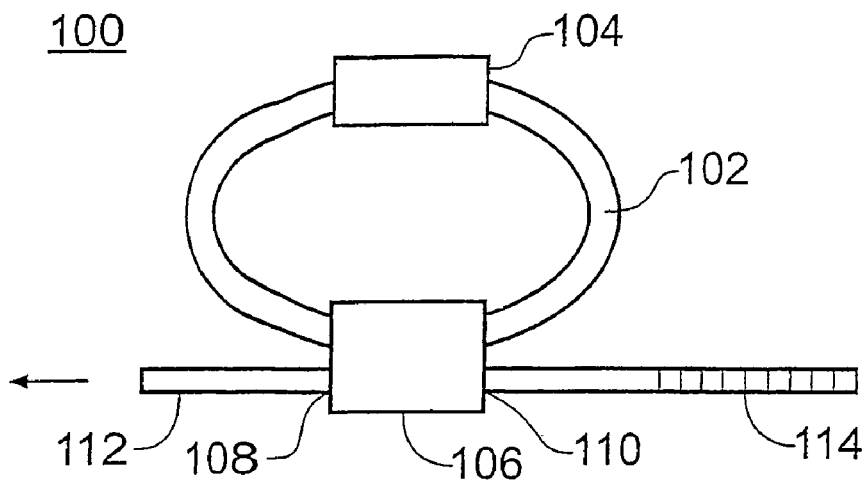
FIG. 1A is a schematic diagram of a tunable laser in accordance with an embodiment.

In the tunable laser 100 of FIG. 1A, a ring cavity 102 (comprised of a passive optical waveguide) and an optical gain element 104 are connected to a bi-directional optical output coupler 106. The optical output coupler 106 has a first port 108 and a second port 110. The first port 108 is coupled to an output optical fibre 112 and a second port 110 is coupled to a frequency selection means 114 (such as a grating).

In operation, the optical gain element 104 provides optical gain within a predetermined spectral range and the ring cavity 102 provides a propagation route for circulating photons at one or more frequencies within the predetermined spectral range. A laser oscillation in the ring cavity 102 occurs at a laser frequency within the gain spectral range when two operating conditions are met. First, the total optical gain at that laser frequency $f_L$ exceeds the total optical loss in the ring cavity 102, and second, the optical phase delay associated with a round trip of a photon within the ring cavity 102 is a multiple of 360 degrees.

Figure 1B:
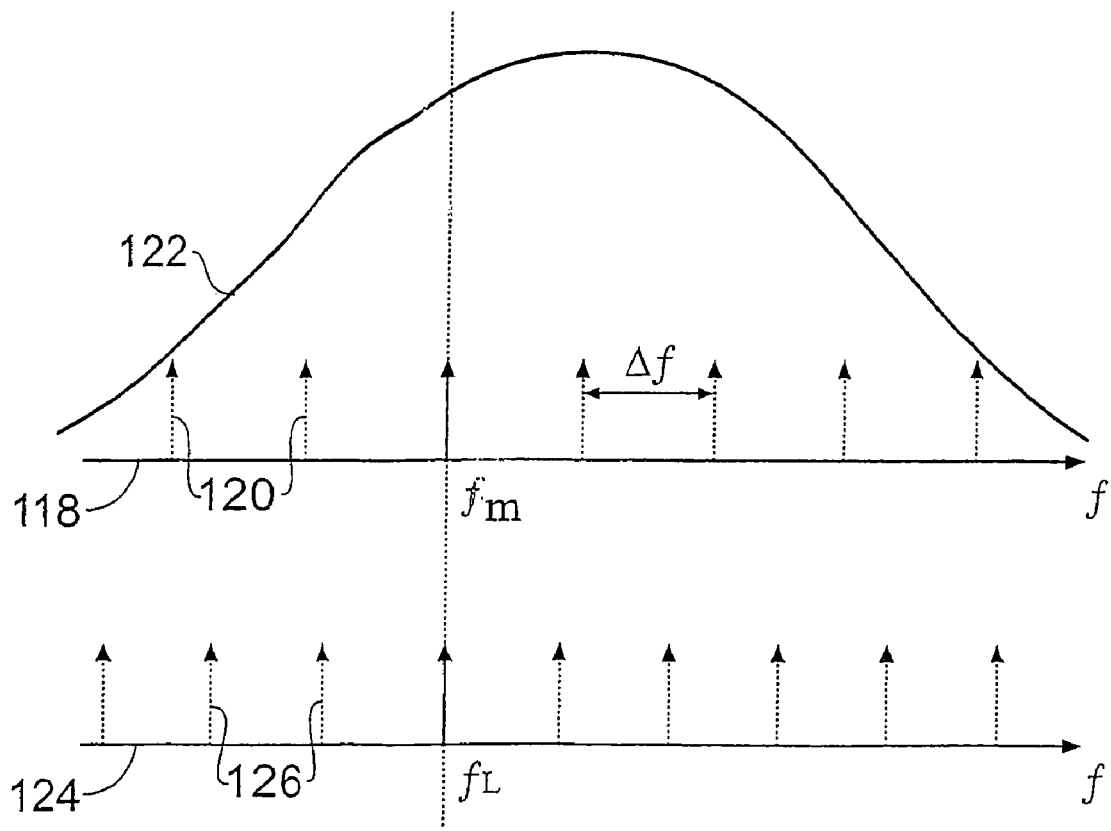
FIG. 1B shows a graph illustrating single mode laser operation of the tunable laser of FIG. 1A.

The graph of FIG. 1B illustrates single mode operation of the ring cavity tunable laser 100. The upper section 118 plots the cavity mode frequencies 120 of the ring cavity 102 and shows the laser gain profile 122, and the lower section 124 plots the reflection frequencies 126 of the frequency selection means 114. Where one of the cavity mode frequencies 120 coincides with one of the grating reflection frequencies 126 single mode laser operation is achieved at frequency $f_L$.

The gain spectral range of the optical gain element 104 (for example, comprising a semiconductor gain medium) usually has a large bandwidth and therefore allows multiple optical frequencies to oscillate at the same time. The cavity mode frequencies 120, $f_m$, of the ring cavity 102 are primarily determined by the following relationship;

$$f_m = \frac{mc}{nL}$$

where n is the effective refractive index of the ring cavity 102, L is the circumference of the ring cavity 102, (in combination nL is the ring cavity optical path length), m is an integer, and c is the speed of light in a vacuum. The ring cavity mode frequency Interval $\Delta f$ is given by;

$$\Delta f = \frac{c}{nL}$$

Clearly, varying the circumference of the ring cavity 102 results in altered ring cavity modes 120. Where a frequency selection means 114 has multiple reflecting frequencies 126 (as illustrated in the lower half of FIG. 1B), rather than a single reflecting frequency, it is necessary that the reflection frequency intervals of the frequency selection means 114 differ from the ring cavity mode frequency intervals $\Delta f$.

Laser emission is initiated by the injection of a pumping energy (e.g., an electric current) into the optical gain element 104. The photon population is increased as the photons pass through the optical gain element 104 until the population gain exceeds the population loss within the ring cavity. Laser output is obtained when the photons exit the ring cavity via the bi-directional output coupler 106.

The frequency selection means 114 selects the lasing frequency of the ring cavity 102 from one of the many ring cavity resonant frequencies. Light output at the selected resonant frequency is reflected and fed back into the ring cavity, thereby enhancing the lasing at the selected ring cavity resonant frequency and suppressing lasing at other ring cavity resonant frequencies due to a mode competition process. This process allows the establishment of lasing at the selected frequency in a short time duration, usually a few nanoseconds. Further, because the selected lasing frequency is determined by the ring cavity according to above formulae, the reflecting frequency band of the frequency selection means only needs to approximately align with the selected ring cavity resonant frequency to allow sufficient optical feedback. Furthermore, after the establishment of the lasing frequency, any small change in the frequency selection means 114 does not affect the lasing frequency.

High speed tuning between single mode laser operation at a first and a second ring cavity mode frequency is achieved in the following way. A first set of reflection frequencies of the frequency selection means 114 is determined by applying a first control signal (such as injecting a first current) into the frequency selection means 114 to set a first value to a physical property (such as refractive index) of the frequency selection means 114. Where one of the first set of reflection frequencies of the frequency selection means 114 is the same as a ring cavity resonant mode frequency, photons at this first frequency are fed back into the ring cavity 102 from the frequency selection means 114, and lasing occurs at this first ring cavity mode frequency. Next, a second set of reflection frequencies of the frequency selection means 114 is determined by applying a second control signal (such as injecting a second current) into the frequency selection means 114 to set a second value to a physical property (such as refractive index) of the frequency selection means 114. Where one of the second set of reflection frequencies of the frequency selection means 114 is the same as a second ring cavity mode frequency, photons at this second frequency are fed back into the ring cavity 102 from the frequency selection means 114, and lasing occurs at this second cavity mode frequency.

Furthermore, prior to applying the second control signal (such as injecting the second current) into the frequency selection means 114, the pumping level of the optical gain element can be reduced to a level less than the ring cavity lasing threshold (which has the effect of switching off the ring cavity laser). After injecting the second current into the frequency selection means 114, the pumping level of the optical gain element is increased to the original level. This has the effect of switching on the ring cavity laser, and so lasing can occur at the second cavity mode frequency.

The alteration of the control signal such as injected current into the frequency selection means 114 can change the effective refractive index of the frequency selection means 114, and therefore the reflection frequencies of the frequency selection means 114 in approximately 1 nanosecond.

Figure 2A:
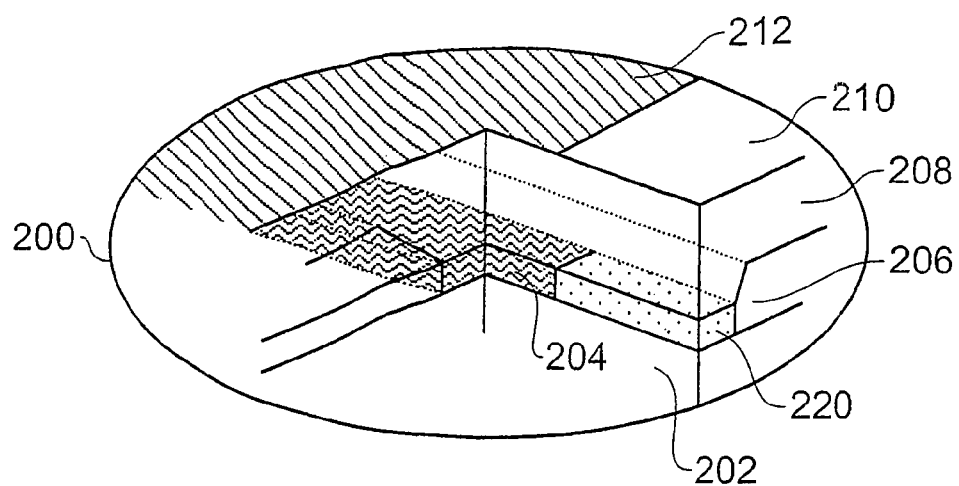
FIG. 2A illustrates an enlarged cross-section of an optical gain element of a first exemplary implementation.

The optical gain element 200 of a first implementation illustrated in FIG. 2A is comprised of a substrate base 202 (such as an III-V semiconductor wafer) onto which an optically active layer 204 is deposited. Further, a semi-insulating semiconductor layer 206, an upper cladding layer 208, a contact layer 210 and finally, ohmic contacts 212 form the upper part of the optical gain element 200.

Figure 2B:
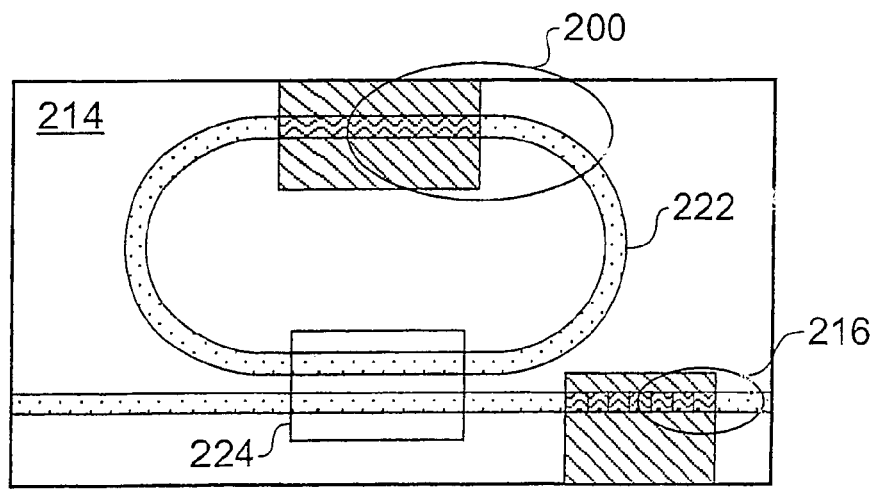
FIG. 2B illustrates a plan view of a ring cavity laser of a first exemplary implementation.
Figure 2C:
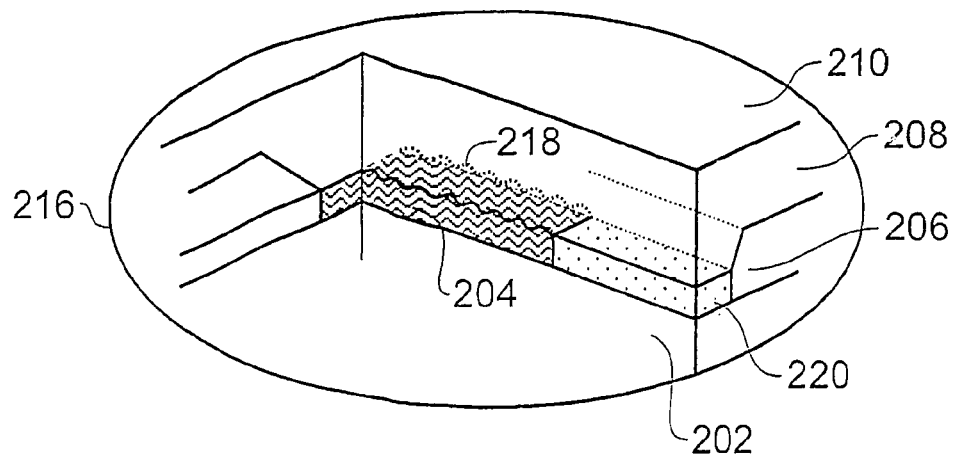
FIG. 2C illustrates an enlarged cross-section of a grating element of a first exemplary implementation.

FIG. 2B shows a complete ring cavity laser 214 including the optical gain element 200 of FIG. 2A and a grating element 216 of FIG. 2C, all of the first implementation. The fabrication process of the ring cavity laser 214 is now described.

In a first epitaxial growth step, an optically active layer 204 that provides optical gain is deposited on the substrate 202. The substrate 202 consists of multiple layers of InGaAsP quaternary compound semiconductor deposited on an Indium Phosphide (InP) substrate. In the area where the grating element 216 is to be fabricated, the surface is patterned by a photolithography or an electron beam lithography process, followed by an etching process, to form grating corrugations 218. The optically active layer 204 is then removed from the substrate 202 except for areas where the optical gain element 200 and the grating element 216 are to be fabricated.

In a second growth step, an optically passive or transparent layer 220 is deposited on the substrate 202 in areas where the optically active layer 204 has been removed. The position of this optically passive layer 220 is vertically aligned to that of the optically active layer 204 (and the thickness of both layers are comparable). The ring cavity laser 214 is then completed by a photolithography process that defines ridge waveguides which form the ring cavity 222, the output coupler 224 and the grating element 216. The entire structure is buried in the semi-insulating semiconductor layer 206 (except for the top of the waveguides) and the upper cladding layer 208 and the contact layer 210 are grown on top. The ohmic contacts 212 are then formed on the optical gain element 200 and the grating 216.

The grating element 216 illustrated in FIG. 2C is generally a sampled grating reflector formed in a similar way to the optical gain element 200 of FIG. 2A.

The lasing and tuning operations of the first implementation of the ring cavity laser 214 (shown in FIGS. 2A, 2B and 2C) are as described for the embodiment of the invention in FIGS. 1A and 1B and will not be repeated here for the sake of brevity.

Figure 3A:
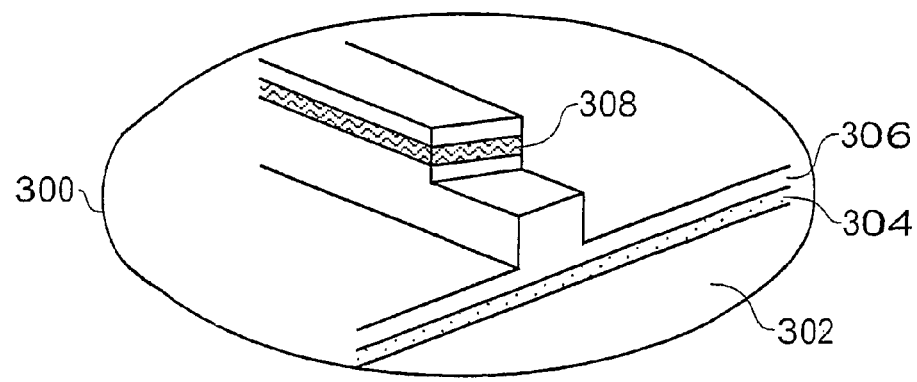
FIG. 3A illustrates an enlarged cross-section of an optical gain element of a second exemplary implementation.

The optical gain element 300 of the second implementation illustrated in FIG. 3A is comprised of a substrate base 302 onto which an optically passive layer 304 is deposited. A spacer layer 306 and an optically active layer 308 form the upper part of the optical gain element 300. The optically active layer 308 forms active vertical couplers with the optically passive layer 304 underneath (thereby creating a photonic integrated circuit (PIC)).

Figure 3B:
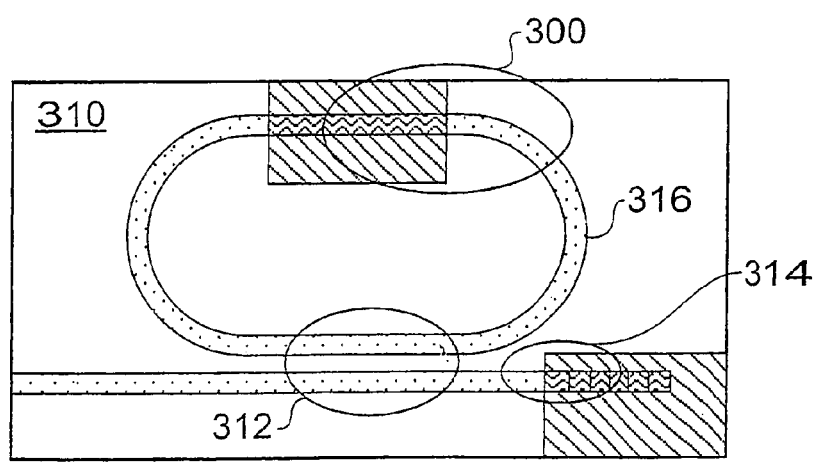
FIG. 3B illustrates a plan view of a ring cavity laser of a second exemplary implementation.
Figures 3C, 3D:
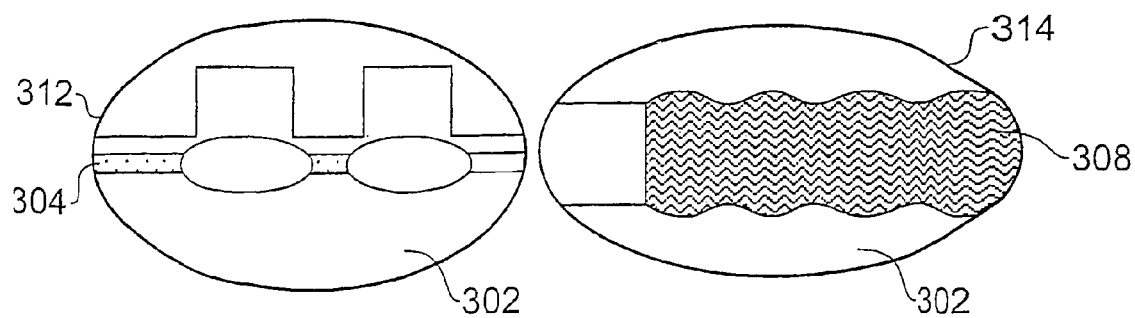
FIG. 3C illustrates an enlarged cross-section of an optical coupler of a second exemplary implementation.
FIG. 3D illustrates an enlarged cross-section of a grating element of a second exemplary implementation.

FIG. 3B shows a complete ring cavity laser 310 including the optical gain element 300 of FIG. 3A, the output coupler 312 of FIG. 3C and the grating element 314 of FIG. 3D, all of a second implementation. Each feature is monolithically integrated onto the substrate 302. The fabrication process of the ring cavity laser 310 is mainly as described for the first implementation of the invention in FIGS. 2A to 2C, with the following exceptions.

The passive ring cavity waveguide 316 and the output coupler 312 are formed in the optically passive layer 304. In order to achieve this, the optically active layer 308 is removed from the substrate 302 in these areas.

The grating element 314, like the gain element 300, is formed in the optically active layer 308. In these areas the active layer is not removed. Light can therefore coupled from the passive layer into the active layer, either to experience optical amplification in the gain element or to interact with the grating element. During fabrication the width of the waveguide, in the area designated for the grating element 314, is periodically varied to form the grating. Alternatively, the grating element 314 can be formed by the etching corrugations in the waveguide.

The lasing and tuning operations of the second implementation of the ring cavity laser 310 (shown in FIGS. 3A, 3B 3C and 3D) are as described for the embodiment of the invention in FIGS. 1A and 1B and will not be repeated here for the sake of brevity.

FIG. 4 shows a complete ring cavity laser 400 of a third implementation. A ring cavity waveguide 402, an optical gain element 404, a grating element 406 and an output coupler 408 are hybrid integrated onto a planar substrate 410. The fabrication process of the ring cavity laser 400 involves deposition of several optically passive layers (not specifically illustrated) onto the substrate 410 which are used to form the ring cavity waveguide 402 and the output coupler 408.

The optical gain element 404 is a semiconductor optical amplifier which is positioned in a gap where the ring cavity waveguide 402 has been removed for that purpose. The length of the gap is suitable for efficient butt-coupling of light into and out of the semiconductor optical amplifier 404. The grating element 406 is separately fabricated in a semiconductor waveguide material and butt-coupled to one of the output waveguides 412 of the ring cavity laser 400.

Preferably, reflection at the butt-coupled joints is minimized. In order to achieve this, it may be necessary to utilize a non-perpendicular angle between the end-facets of the gain element 404 or grating element 406 and the waveguides 402 412. Other anti-reflection means, such as optical coatings can also be employed.

The lasing and tuning operations of the third implementation of the ring cavity laser 400 (shown in FIG. 4) are as described for the embodiment of the invention in FIGS. 1A and 1B and will not be repeated here for the sake of brevity.

It will be apparent to the skilled person that the above described implementations are not exhaustive and variations on these structures may be employed to achieve a similar result whilst employing the same concept. Individual elements within each implementation can be replaced with any element or combination of elements which performs a similar function. For example, the grating element may be replaced with any suitable multi-frequency band filter. Further, the positions of the optically passive layer and the optically active layer may be interchangeable in sonic implementations (similar to the second implementation of the present invention). Consequently the fabrication process would need to be adapted. Furthermore, it is also possible to implement non-wavegnide forms of the invention, in which one or more of the ring laser cavity, the output coupling mechanism, the optical gain element, or the frequency selection means are not formed in waveguides.

It can therefore be seen that the exemplary embodiment presented herein provides a tunable lasing device which has significant advantages over conventional devices.

The invention claimed is:

1. A tunable ring laser device comprising:
   a ring laser comprising a ring resonator element and an optical gain element that forms part or all of the ring resonator element, the ring resonator element and optical gain element being operable in combination to generate a laser emission at a range of frequencies decided by a resonant frequency of the ring resonator element;
   a coupling element for extracting laser emission from the ring laser; and
   a frequency selection element located outside the ring resonator element, and not forming part of the ring resonator element, the frequency selection element being connected to the ring resonator element by way of the said coupling element, and being operable to reflect a part of the extracted laser emission into the ring resonator element, and to select the frequency of said part of the extracted laser emission;
   said frequency selection element incorporating a mechanism for changing the frequency of the reflected light.

2. The tunable ring laser device as claimed in claim 1, wherein the frequency selection element is a grating.

3. The tunable ring laser device as claimed in claim 2, wherein the ring resonator element is an enclosed waveguide path.

4. The tunable ring laser device as claimed in claim 3, wherein the coupling element comprises a waveguide coupler.

5. The tunable ring laser device as claimed in claim 4, wherein the optical gain element is a semiconductor material.

6. The tunable ring laser device as claimed in claim 5, wherein the waveguide coupler is a bi-directional coupler.

7. The tunable ring laser device as claimed in claim 6, wherein the frequency selection element and the optical gain element comprise an optically passive layer and an optically active layer, a semi-insulating layer, an upper cladding layer and an ohmic contact layer; and the frequency selection element further comprising corrugations formed by an etching process.

8. The tunable ring laser device as claimed in claim 6, wherein the optical gain element, the grating, the waveguide coupler and the ring resonator element are monolithically integrated onto a substrate.

9. The tunable ring laser device as claimed in claim 8, wherein the optical gain element comprises an optically passive layer and an optically active layer separated by a spacer layer;
   the grating comprises a waveguide made from an optically passive layer and an optically active layer; and
   the waveguide coupler and the ring resonator element are formed in an optically passive layer.

10. The tunable ring laser device as claimed in claim 9, wherein the grating is formed by periodically varying the width of the waveguide.

11. The tunable ring laser device as claimed in claim 9, wherein the grating is formed by etching corrugations in the waveguide.

12. The tunable ring laser device as claimed in claim 6, wherein the optical gain element, the grating, the waveguide coupler and the ring resonator element are hybrid integrated onto a substrate.

13. The tunable ring laser device as claimed in claim 12, wherein the substrate material is optically transparent to a lasing wavelength.

14. The tunable ring laser device as claimed in claim 1, wherein the frequency selection element comprises:
   a control element for controlling a refractive index of the frequency selection element.

15. The tunable ring laser device as claimed in claim 14, wherein the control element is a variable current source.

16. The tunable ring laser device as claimed in claim 15, wherein lasing occurs where a resonant frequency of the ring resonator element is substantially the same as the reflecting frequency of the frequency selection element.

17. An optical communication system including a tunable ring laser device as claimed in claim 1.

18. A method of changing a lasing frequency of a ring laser that comprises a ring resonator element and an optical gain element that forms part or all of the ring resonator element, a coupling element for extracting laser emission from the ring laser, a frequency selection element located outside the ring resonator element, and not forming part of the ring resonator element, the frequency selection element being connected to the ring resonator element by way of the said coupling element, said frequency selection element incorporating a mechanism for changing the frequency of the reflected light, the method comprising:
   generating, through operation of the ring resonator element and the optical gain element that forms part or all of the ring resonator element, a laser emission at a range of frequencies decided by a resonant frequency of the ring resonator element;
   reflecting, through operating the frequency selection element located outside the ring resonator element, and not forming part of the ring resonator element, a part of an extracted laser emission into the ring resonator element;
   operating the ring laser at a first ring resonant frequency, wherein a reflecting frequency of the frequency selection element substantially coincides with a first ring resonant frequency;
   controlling the frequency selection element to change the reflecting frequency from the first reflecting frequency to a second reflecting frequency; and thereby operating the ring laser at a second ring resonant frequency, wherein the second reflecting frequency of the frequency selection element substantially coincides with the second ring resonant frequency.

19. The method of changing a lasing frequency of a ring laser as claimed in claim 18, wherein controlling the frequency selection element comprises controlling a refractive index of the frequency selection element.

20. The method of changing a lasing frequency of a ring laser as claimed in claim 19, the method further comprising:
reducing a pumping level of an optical gain element to a level less than a lasing threshold for the duration of changing the frequency selecting element from the first reflecting frequency to the second reflecting frequency; and
restoring the pumping level of the optical gain element to above the lasing threshold after the change from the first reflecting frequency to the second reflecting frequency.

21. The method of changing a lasing frequency of a ring laser as claimed in claim 20, wherein the frequency selection element is a grating.

22. The method of changing a lasing frequency of a ring laser as claimed in claim 21, wherein the ring resonator element comprises a ring-shaped optical waveguide.

23. The method of changing a lasing frequency of a ring laser as claimed in claim 22, wherein the coupling element comprises a waveguide coupler.

24. The method of changing a lasing frequency of a ring laser as claimed in claim 23, wherein the optical gain element is a semiconductor material.

25. The method of changing a lasing frequency of a ring laser as claimed in claim 24, wherein the waveguide coupler is a bi-directional coupler.

26. A method of selecting the lasing frequency of a ring laser that comprises a ring resonator element and an optical gain element that forms part or all of the ring resonator element, a coupling element for extracting laser emission from the ring laser, a frequency selection element located outside the ring resonator element, and not forming part of the ring resonator element, the frequency selection element being connected to the ring resonator element by way of the said coupling element, said frequency selection element incorporating a mechanism for changing the frequency of the reflected light, the method comprising:
operating the optical gain element that forms part or all of the ring resonator element so that the ring laser emits a laser emission;
operating the frequency selection element located outside the ring resonator element and not forming part of the ring resonator element so that its reflection frequency essentially coincides with a resonant frequency of the ring resonator element.

27. A method of selecting the lasing frequency of a ring laser that comprises a ring resonator element and an optical gain element that forms part or all of the ring resonator element, a coupling element for extracting laser emission from the ring laser, a frequency selection element located outside the ring resonator element, and not forming part of the ring resonator element, the frequency selection element being connected to the ring resonator element by way of the said coupling element, said frequency selection element incorporating a mechanism for changing the frequency of the reflected light, the method comprising:
operating the optical gain element that forms part or all of the ring resonator element so that the ring laser emits a laser emission;
operating the reflection frequency selection element located outside the ring resonator element and not forming part of the ring resonator element so that its reflection frequency essentially coincides with a first resonant frequency of the ring resonator element, so that the ring laser device emits essentially at the first resonant frequency of the ring resonator element;
changing the reflection frequency of the frequency selection element so that its reflection frequency essentially coincides with a second resonant frequency of the ring resonator element, so that the ring laser emits essentially at the second resonant frequency of the ring resonator element.

28. A method of selecting the lasing frequency of a ring laser that comprises a ring resonator element and an optical gain element that forms part or all of the ring resonator element, a coupling element for extracting laser emission from the ring laser, a frequency selection element located outside the ring resonator element, and not forming part of the ring resonator element, the frequency selection element being connected to the ring resonator element by way of the said coupling element, said frequency selection element incorporating a mechanism for changing the frequency of the reflected light, the method comprising:
operating the optical gain element that forms part or all of the ring resonator element so that the ring laser emits a laser emission;
operating the reflection frequency selection element located outside the ring resonator element and not forming part of the ring resonator element so that its reflection frequency essentially coincides with a first resonant frequency of the ring resonator element, so that the ring laser emits essentially at the first resonant frequency of the ring resonator element;
reducing the gain of the optical gain element to a level less than the lasing threshold of the ring resonator element for a duration of time, so that the ring laser essentially does not produce laser emission, and in this duration, changing the reflection frequency of the frequency selection element so that its reflection frequency essentially coincides with a second resonant frequency of the ring resonator element, so that the ring laser emits essentially at the second resonant frequency of the ring resonator element;
restoring the gain of the optical gain element to above the lasing threshold of the ring resonator element; wherein the ring laser emits essentially at the second resonant frequency of the ring resonator element.

* * * * *